(12) United States Patent
Aoshima

(10) Patent No.: US 9,153,417 B2
(45) Date of Patent: Oct. 6, 2015

(54) BACK SCATTERED ELECTRON DETECTOR

(71) Applicants: TOTO LTD., Kitakyushu-shi, Fukuoka (JP); Hitachi High-Technologies Corporation, Minato-ku, Tokyo (JP)

(72) Inventor: Toshihiro Aoshima, Kitakyushu (JP)

(73) Assignees: TOTO LTD., Kitakyushu-shi (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/287,016

(22) Filed: May 24, 2014

(65) Prior Publication Data

US 2014/0339436 A1    Nov. 20, 2014

Related U.S. Application Data

(63) Continuation-in-part of application No. 14/356,191, filed as application No. PCT/JP2012/079313 on Nov. 12, 2012, now Pat. No. 9,053,902.

(30) Foreign Application Priority Data

Nov. 25, 2011 (JP) ................. 2011-257056
May 24, 2013 (JP) ................. 2013-110022

(51) Int. Cl.
*H01J 37/26* (2006.01)
*G21K 5/04* (2006.01)
*H01J 37/244* (2006.01)
*H01J 37/29* (2006.01)
*H01J 37/28* (2006.01)

(52) U.S. Cl.
CPC ............... *H01J 37/244* (2013.01); *H01J 37/28* (2013.01); *H01J 37/29* (2013.01); *H01J 2237/2445* (2013.01); *H01J 2237/24415* (2013.01); *H01J 2237/24475* (2013.01)

(58) Field of Classification Search
USPC ............ 250/396 R, 397, 305, 306, 307, 309, 250/310, 311
See application file for complete search history.

(56) References Cited

U.S. PATENT DOCUMENTS

| | | | |
|---|---|---|---|
| 2004/0208280 A1 | 10/2004 | Yada et al. | |
| 2006/0219914 A1 | 10/2006 | Suga et al. | |
| 2011/0031215 A1 | 2/2011 | Mantz et al. | |
| 2012/0025074 A1 | 2/2012 | Barbi et al. | |
| 2012/0160999 A1* | 6/2012 | Zaluzec | 250/307 |
| 2013/0032713 A1* | 2/2013 | Barbi et al. | 250/307 |

FOREIGN PATENT DOCUMENTS

| | | |
|---|---|---|
| JP | 58-174856 U | 11/1983 |
| JP | 03-048852 U | 5/1991 |

(Continued)

*Primary Examiner* — Nicole Ippolito
(74) *Attorney, Agent, or Firm* — Miles & Stockbridge P.C.

(57) ABSTRACT

It is an object of the present invention to provide a back scattered electron detector suitable for implementing a method for determining beforehand in which region of a sample an X-ray detector can obtain an accurate X-ray detection image and perform an appropriate analysis. A Coax-BSE detector which is a back scattered electron detector includes a BSE element, a support member that supports the BSE element, and a fixing member to fix the support member to the X-ray detector, in which the fixing member fixes the support member by clamping a side portion on the distal end side which is an X-ray receiving side of a housing that covers the X-ray detector.

9 Claims, 14 Drawing Sheets

(56) References Cited

FOREIGN PATENT DOCUMENTS

| | | |
|---|---|---|
| JP | 2004-138461 A | 5/2004 |
| JP | 2006-252995 A | 9/2006 |
| JP | 2009-181922 A | 8/2009 |
| JP | 2011-040384 A | 2/2011 |
| WO | WO 2012/016198 A2 | 2/2012 |

* cited by examiner

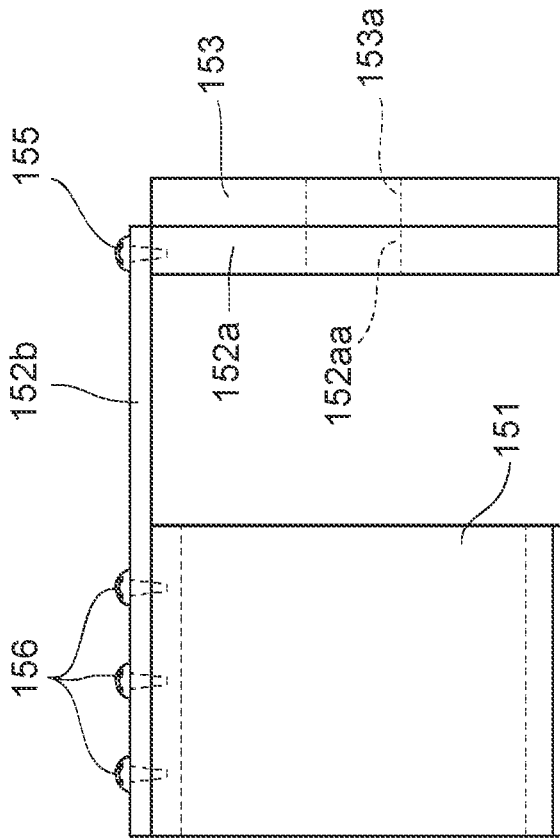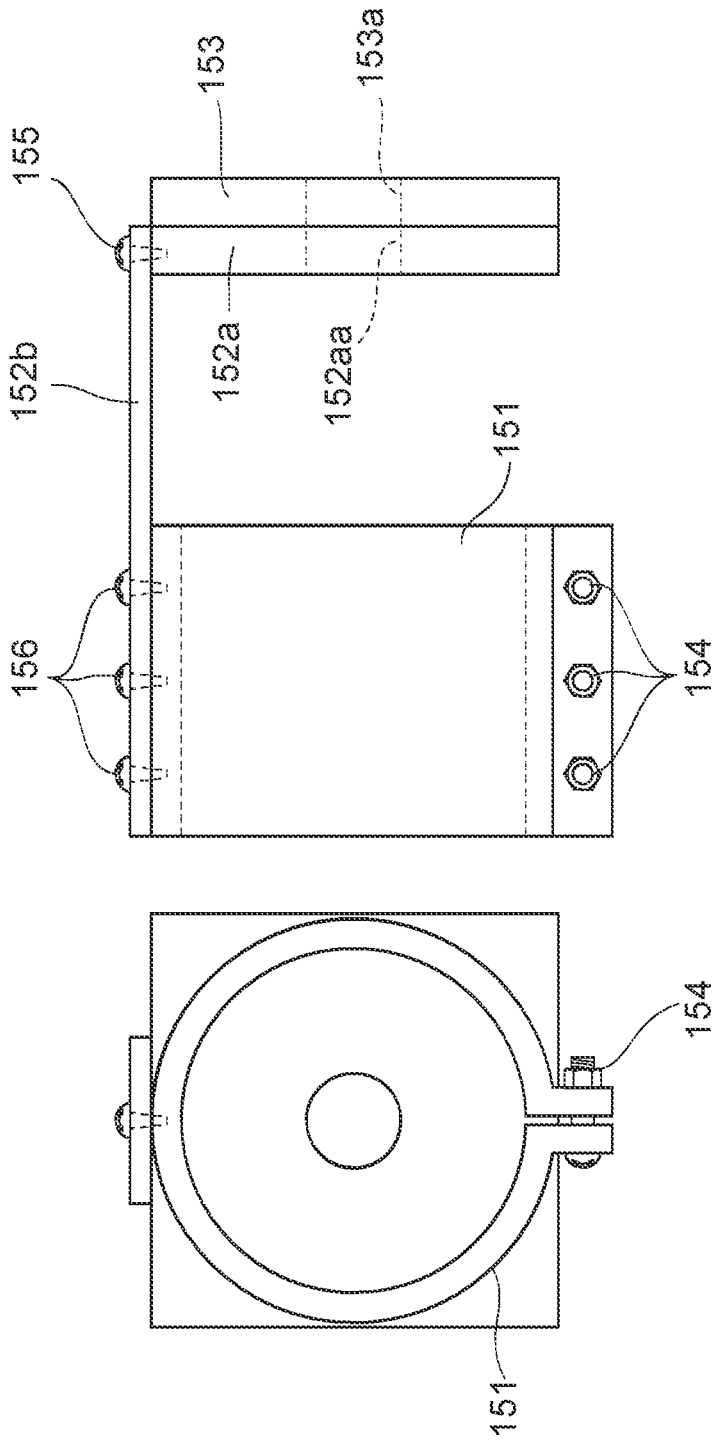

FIG.4A
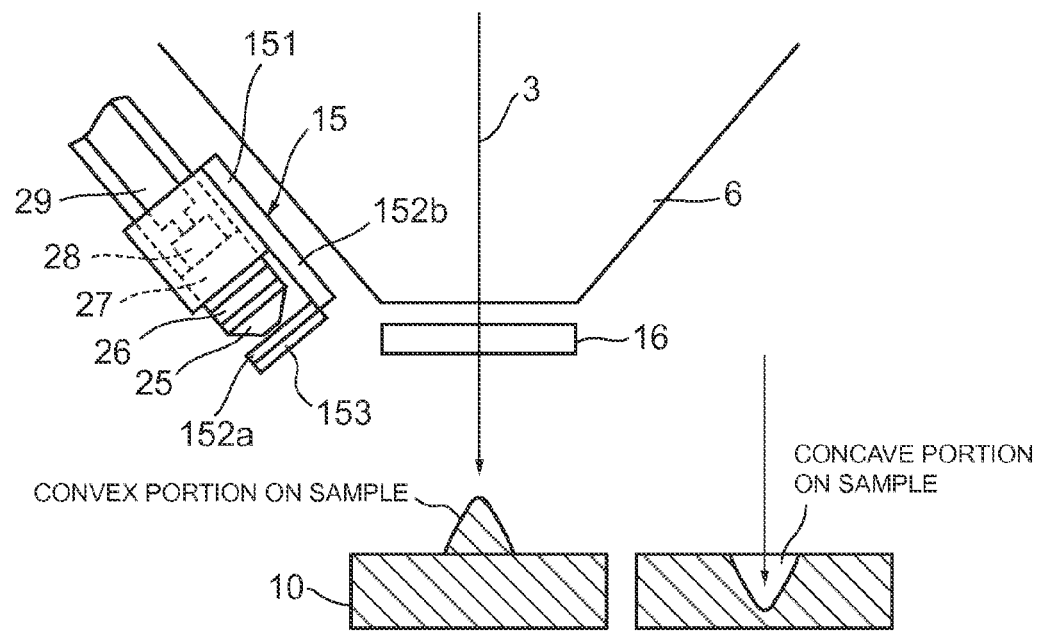
CONVEX PORTION ON SAMPLE
CONCAVE PORTION ON SAMPLE
FIG.4B
COAX-BSE DETECTOR ARRANGEMENT DIRECTION
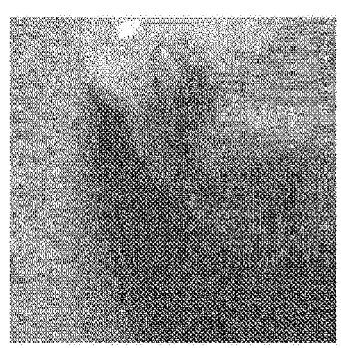
COAX-BSE IMAGE
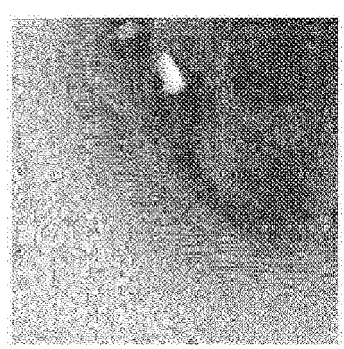
TOP-BSE IMAGE

| $B_{1,1}$ | $B_{2,1}$ | $B_{3,1}$ |  | ... | $B_{m,1}$ |
|---|---|---|---|---|---|
| $B_{1,2}$ |  |  |  |  | ⋮ |
| $B_{1,3}$ |  |  |  |  |  |
| ⋮ |  |  |  |  |  |
|  |  |  |  |  |  |
| $B_{1,n}$ | ... |  |  |  | $B_{m,n}$ |

BACK SCATTERED ELECTRON DETECTOR

BACKGROUND OF THE INVENTION

1. Field of the Invention

The present invention relates to a back scattered electron detector used together with an X-ray detector included in a charged particle beam apparatus and a charged particle beam apparatus including this back scattered electron detector.

2. Description of the Related Art

When performing an X-ray element analysis using a charged particle beam apparatus typified by a scanning electron microscope, a secondary electron detector and a back scattered electron detector are used in addition to an X-ray detector. A back scattered electron detector (also referred to as "BSE detector") is disposed between an objective lens and the surface of a sample. Using the secondary electron detector and the back scattered electron detector, an analysis position can be optionally determined while acquiring an image. The X-ray detector is disposed at an angular position different from those of the secondary electron detector and the back scattered electron detector to detect and analyze characteristic X-rays.

In a sample surface analysis using the scanning electron microscope, the surface of a sample to be observed is normally not a completely flat surface, but includes many projections and depressions. For this reason, when there are obstacles such as projections and depressions resulting from the sample surface shape and surface roughness between the X-ray detector and the analysis position on the sample surface, characteristic X-rays generated from the analysis position are blocked by the projections and depressions and the spectral intensity obtained by the X-ray detector decreases. Furthermore, when there is a significant difference in the energy of a detected spectrum (e.g., Al—K and Cu—K), the decreasing rate of the spectral intensity on the low energy side increases and a peak intensity ratio is detected differently.

Therefore, when there are projections and depressions on the analysis surface, it is not possible to perform an accurate analysis in locations hidden behind the projections and depressions when viewed from the X-ray detector. Moreover, when a normal X-ray element analysis is performed, an analysis range is determined while viewing a back scattered electron image from which a composition contrast is obtained in addition to a secondary electron image obtained by a secondary electron detector. However, it is difficult to distinguish locations where the spectral intensity decreases from a back scattered electron image obtained by the back scattered electron detector disposed right above the sample surface. When performing an X-ray element analysis using such a method, an analyzer determines an analysis range by estimating the concavo-convex shape of the sample surface from the secondary electronic image obtained by the secondary electron detector including shape information and evaluates the analysis result obtained from experiences. If there are parts where it is judged that X-rays cannot be detected due to projections and depressions in the analysis range or that a decrease of intensity of X-rays affects analysis data, it is necessary to readjust a positional relationship between the sample and the X-ray detector and recollect (rework) data. Note that if the positional relationship between the sample and the X-ray detector cannot be readjusted, there is no choice but to consider the analysis result by taking into account the concavo-convex condition of the sample surface from the analysis data obtained, and accurate data interpretation may not be possible.

A technique described in WO2012/016198 proposes to dispose a back scattered electron detector in the vicinity of an X-ray detector and eliminate misalignment between an X-ray detected image and a back scattered electron image.

The present inventor et al. discovered a method of disposing, when there are projections and depressions on an analysis surface, a back scattered electron detector in the vicinity of an X-ray detector, using a back scattered electron image detected by the back scattered electron detector, and determining beforehand in which region of a sample the X-ray detector can acquire an accurate X-ray detection image and perform an appropriate analysis. In the process of examining an apparatus suitable for such an analysis technique, the inventor et al. discovered that enabling a back scattered electron detector to be mounted on an existing X-ray detector would significantly expand an application range of this analysis technique.

The present invention has been implemented in view of the above-described problems, and it is an object of the present invention to provide a back scattered electron detector that can be mounted on an existing X-ray detector and suitable for implementing a method for determining beforehand in which region of a sample the X-ray detector can obtain an accurate X-ray detection image and perform an appropriate analysis. Furthermore, a charged particle beam apparatus provided with the back scattered electron detector is also provided.

SUMMARY OF THE INVENTION

In order to solve the above-described problems, a back scattered electron detector according to the present invention is a back scattered electron detector used together with an X-ray detector included in a charged particle beam apparatus, the back scattered electron detector including a reflected electron detection element, a support member that supports the reflected electron detection element, and a fixing member for fixing the support member to the X-ray detector, in which the fixing member fixes the support member by clamping a side portion on a distal end side which is an X-ray receiving side of a housing that covers the X-ray detector.

According to the present invention, the fixing member is fixed by clamping the side portion on the distal end of the housing of the X-ray detector, and can thereby mount the back scattered electron detector on the X-ray detector by providing the fixing member that matches the shape of the housing irrespective of the type of the X-ray detector. Moreover, since the support member that supports the reflected electron detection element is provided, it is possible to dispose the reflected electron detection element at an optimum position in accordance with the shape and condition of a sample to be detected, and the type of the X-ray detector.

In the back scattered electron detector according to the present invention, the support member is preferably configured so as to be detachably attached to the fixing member.

In this preferred aspect, since the support member is configured so as to be detachably attached to the fixing member, it is easier to use the support member of an optimum shape to dispose the reflected electron detection element at an optimum position in accordance with the shape and condition of the sample to be detected and the type of the X-ray detector.

The back scattered electron detector according to the present invention may be preferably configured such that a conductor for transmitting a reflected electron signal outputted from the reflected electron detection element is provided, one end of the conductor is connected to the reflected electron detection element so that the conductor extends toward a rear end side which is the X-ray detection element side of the housing and the other end side is connectable to a feedthrough of the charged particle beam apparatus.

The X-ray detector provided for the charged particle beam apparatus may be configured so as to be freely movable to and fro in an antero-posterior direction thereof, and allowed to approach the sample when performing an X-ray element analysis and be distanced away from the sample when performing no X-ray element analysis. In this preferred aspect, the back scattered electron detector may be configured so as to avoid the conductor from wrapping around the distal end side which is the X-ray receiving side of the X-ray detector as the X-ray detector moves and prevent the conductor from interfering with the movement of the X-ray detector. By adopting such a configuration, even when mounted on an existing X-ray detector, a reflected electron signal outputted from the back scattered electron detector can be outputted to the outside via the conductor without modifying the X-ray detector at all.

In the back scattered electron detector according to the present invention, the conductor is preferably a coil. Adopting a coil as the conductor in this way can prevent the conductor from slackening even when the X-ray detector retracts.

A charged particle beam apparatus according to the present invention is a charged particle beam apparatus provided with an X-ray detector, including the aforementioned back scattered electron detector mounted on the distal end side which is the X-ray receiving side of the housing that covers the X-ray detector, in which the X-ray detector detects an X-ray signal and the back scattered electron detector detects a reflected electron signal.

According to the present invention, it is possible to detect a reflected electron signal in a preliminary stage of performing an X-ray analysis, determine a position on the sample suitable for the X-ray analysis and reduce so-called rework, that is, recollection of data by readjusting a positional relationship between the sample and the X-ray detector.

The charged particle beam apparatus according to the present invention preferably analyzes the amount of reflected electron signal per pixel in a back scattered electron image using the back scattered electron image obtained based on the reflected electron signal and determines detection efficiency of the X-ray signal.

In this preferred aspect, it is possible to determine the appropriateness of X-ray detection from the amount of reflection signal per pixel and more reliably determine a portion suitable for X-ray detection.

BRIEF DESCRIPTION OF THE DRAWINGS

FIG. 3A is a front view of the Coax-BSE detector shown in FIG. 2 and FIG. 3B is a side view of the Coax-BSE detector;

FIG. 4A is a schematic layout drawing of the Coax-BSE detector and a top-BSE detector in the scanning electron microscope shown in FIG. 1 and FIG. 4B shows sample images illustrating examples acquired by the Coax-BSE detector and the top-BSE detector respectively;

FIG. 5A illustrating a schematic diagram illustrating a position of the X-ray detector when performing no X-ray element analysis and FIG. 5B illustrating the position of the X-ray detector when performing an X-ray element analysis;

FIG. 15A illustrating a Coax-BSE image and FIG. 15B illustrating an image resulting from dividing the Coax-BSE image shown in FIG. 15A into pixels; FIG. 16A illustrating a case where a contrast threshold is set and FIG. 16B illustrating a case where contrast and the number of partitions of an image are set.

DETAILED DESCRIPTION OF THE PREFERRED EMBODIMENT

Figure 1:
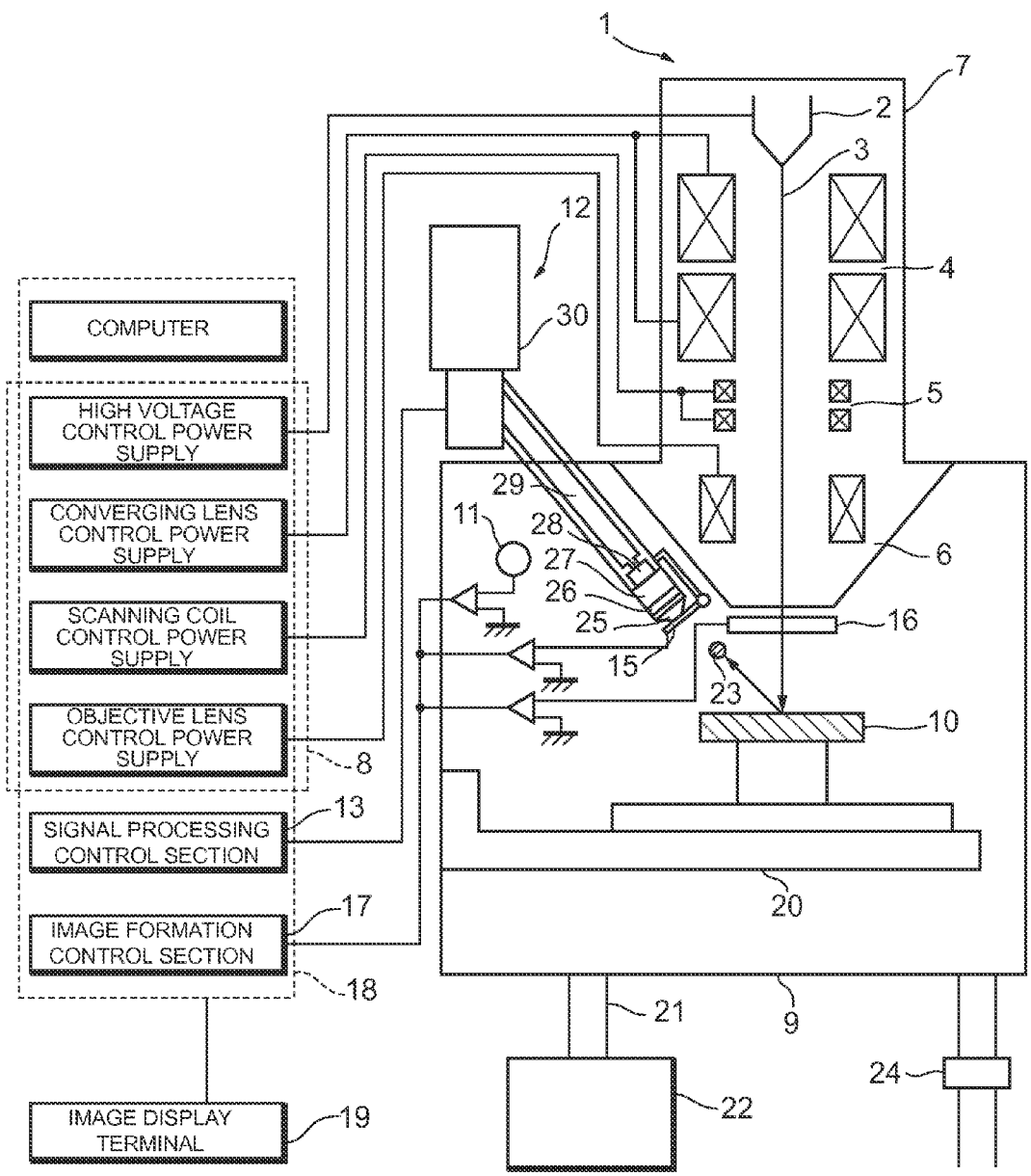
FIG. 1 is an overall schematic configuration diagram of a charged particle beam apparatus (scanning electron microscope) according to an embodiment.

Hereinafter, an embodiment of the present invention will be described with reference to the accompanying drawings. In order to facilitate an understanding of the description thereof, the same components among the respective drawings will be assigned the same reference numerals whenever possible and duplicate description will be omitted.

In order to perform an accurate X-ray element analysis, it is necessary to identify a place where X-rays are blocked by projections and depressions, that is, a place where X-rays are hidden from the X-ray detector and ascertain a place from which correct data is obtained. Thus, the present inventor et al. studied various methods for ascertaining a place on a sample from which correct data could be obtained, and discovered a method for installing a back scattered electron detector coaxial with an X-ray detector (hereinafter expressed as "Coax-BSE detector" for convenience; Coax: ANSI acronym for Coaxial) so that the X-ray detector could cause the reflected electron detection element to approach extremely close to a line for receiving X-rays and both detectors would be coaxial with each other as much as possible and acquiring a back scattered electron image viewed from the X-ray detector (hereinafter expressed as Coax-BSE image for convenience).

The present embodiment uses shape information of the sample surface viewed from the X-ray detector side using the Coax-BSE detector together with reflected electron information from the Coax-BSE detector as a single unit or the top-BSE detector in a preliminary stage of performing an X-ray element analysis, and can thereby present reliability of the analysis result to the analyzer and allow the analyzer to perform an analysis with high reliability secured, without rework and in a short time.

Since reflected electrons have high energy and a high degree of rectilinear propagation property as in the case of X-rays, if there are projections and depressions between the Coax-BSE detector and the sample surface shape, a reflected electron signal is blocked and the amount of signal decreases. Therefore, the amount of reflected electron signal of a Coax-BSE image has a certain correlation with the amount of X-ray signal, and it is possible to estimate the amount of X-ray signal by viewing the Coax-BSE image. That is, a large amount of X-ray signal is detected in a place where the Coax-BSE image is bright, whereas a small amount of X-ray signal is detected in a place where the Coax-BSE image is dark.

By acquiring a Coax-BSE image beforehand, the analyzer can visually grasp the detection efficiency of X-rays and can select a place where an accurate analysis (data acquisition whereby correct X-ray peak intensity can be compared without being influenced by projections and depressions) is possible. Moreover, by performing an image analysis using a combination with a Coax-BSE image as a single unit or a top-BSE image, it is possible to automatically evaluate X-ray detection efficiency of an observation visual field and automatically determine whether the visual field is suitable for an analysis or not. Note that the detection element of the BSE detector needs only to be installed in the vicinity of the X-ray detector and need not always be coaxial with the X-ray detector. In addition, the Coax-BSE detector may be called a "first back scattered electron detector" and the top-BSE detector may be called a "second back scattered electron detector" for convenience.

Figure 2:
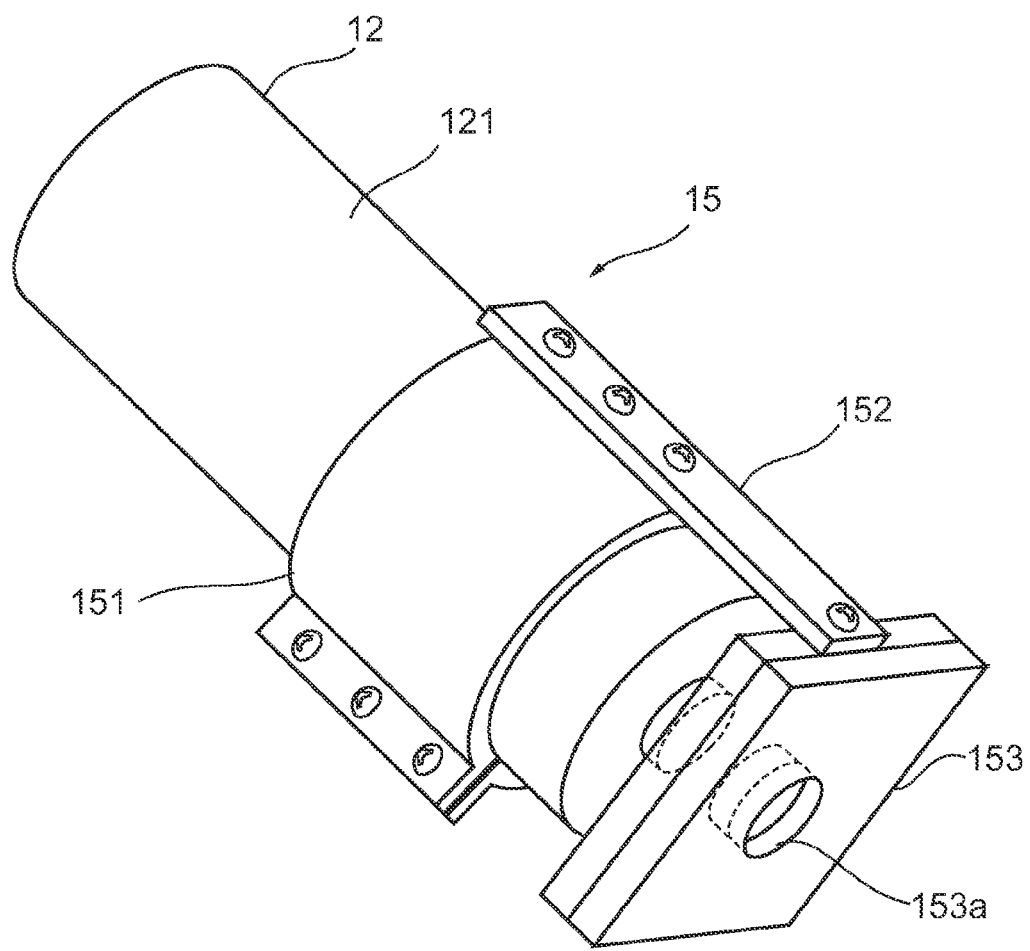
FIG. 2 is a schematic perspective view of a Coax-BSE detector in the scanning electron microscope shown in FIG. 1.
Figure 5A:
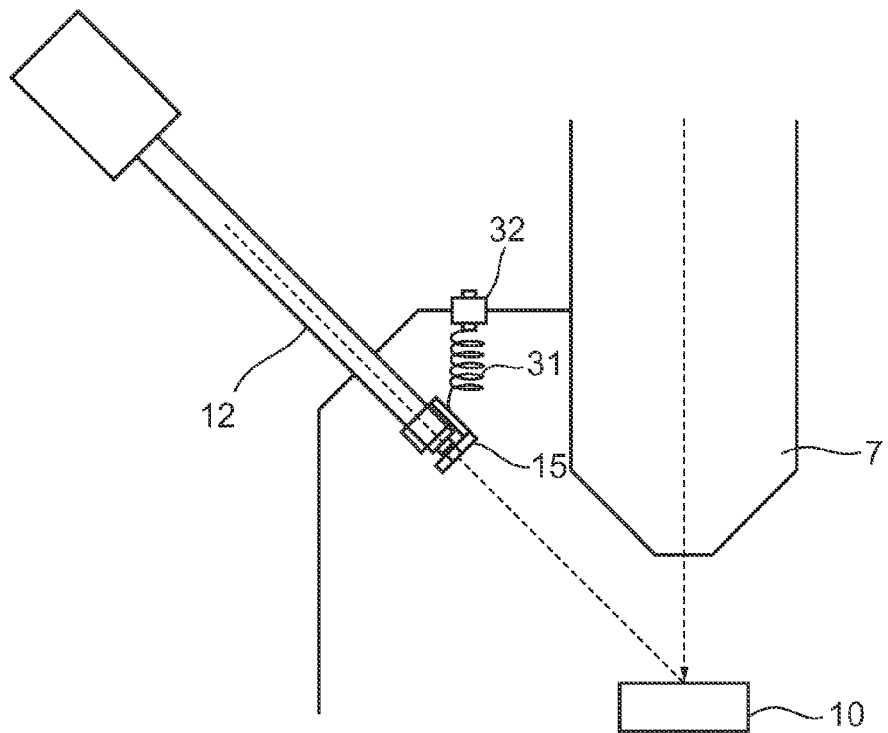
FIG. 5A and FIG. 5B are schematic diagrams illustrating a drive state of the X-ray detector of the scanning electron microscope shown in FIG. 1.
Figure 5B:
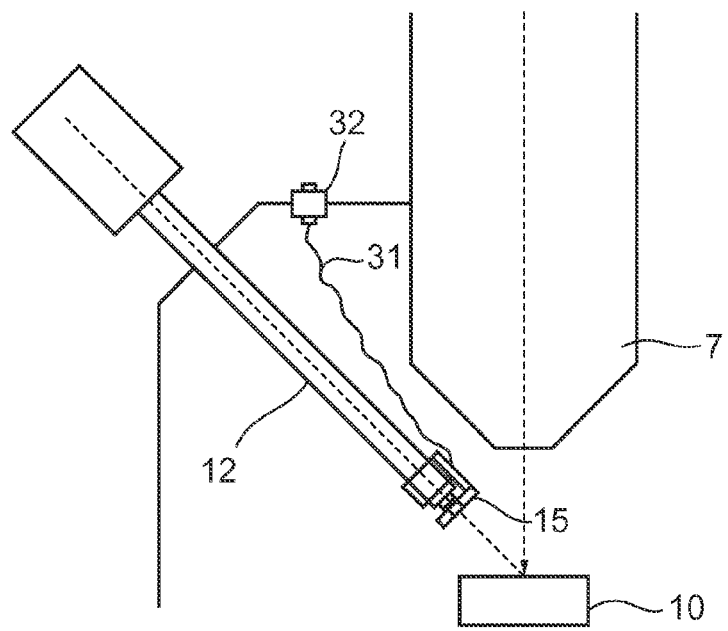

An embodiment of the present invention will be described with reference to FIG. 1 to FIG. 5. FIG. 1 is an overall schematic configuration diagram of a scanning electron microscope which is a charged particle beam apparatus according to an embodiment. FIG. 2 is a schematic perspective view of a Coax-BSE detector in the scanning electron microscope shown in FIG. 1. FIG. 3A is a front view of the Coax-BSE detector shown in FIG. 2 and FIG. 3B is a side view of the Coax-BSE detector. FIG. 4A is a schematic layout drawing of the Coax-BSE detector and the top-BSE detector in the scanning electron microscope shown in FIG. 1 and FIG. 4B shows sample images illustrating examples acquired in the Coax-BSE detector and the top-BSE detector respectively. FIG. 5 is a schematic diagram illustrating a drive state of the X-ray detector of the scanning electron microscope shown in FIG. 1; FIG. 5A illustrating a schematic diagram illustrating a position of the X-ray detector when no X-ray element analysis is performed and FIG. 5B illustrating a position of the X-ray detector when an X-ray element analysis is performed;

As shown in FIG. 1, a scanning electron microscope 1 is provided with an electron source 2, a condenser lens 4, a deflecting coil 5, an electron optical system 7, an electron optical system control section 8, a specimen chamber 9, a secondary electron detector 11, an X-ray detector 12, a signal processing control section 13, a Coax-BSE detector 15, a top-BSE detector 16, an image formation control section 17, an image display terminal 19, a specimen stage 20, and a vacuum pump 22.

The condenser lens 4 is intended to converge a primary electron beam 3 emitted from the electron source 2. The deflecting coil 5 is intended to scan the primary electron beam 3. The electron optical system 7 includes an objective lens 6 that focuses the primary electron beam 3. The electron optical system control section 8 is intended to control drive conditions of the electron optical system 7.

The secondary electron detector 11 detects secondary electrons generated from a sample 10 through radiation of primary electron beam 3 onto the sample 10 as a detection target. The X-ray detector 12 is an energy dispersive detector that detects characteristic X-rays. The signal processing control section 13 is a section that processes and analyzes a signal outputted from the X-ray detector 12. The Coax-BSE detector 15 is fixed to an arm 14 hanging from the specimen chamber 9 and intended to detect reflected electrons. The top-BSE detector 16 is disposed on an undersurface of the objective lens 6.

The image formation control section 17 is intended to process image signals outputted from the secondary electron detector 11, the Coax-BSE detector 15 and the top-BSE detector 16 and form an image. The image display terminal 19 is a display section connected to an SEM overall control section 18. The specimen stage 20 can operate a total of five axes; two axes in the horizontal direction, and the rotating direction, the inclined direction and the vertical direction through motor drive or the like, and can grasp positional information of the sample 10. The vacuum pump 22 is connected to the specimen chamber 9 via a vacuum pipe 21. Here, although it has been described that the control sections such as the electron optical system control section 8, the signal processing control section 13, the image formation control section 17, and the SEM overall control section 18 are individually configured, the control sections may also be configured into one control section.

The electron source 2 generally radiates the primary electron beam 3 of 0.3 kV to 30 kV. The primary electron beam 3 is made to converge through the condenser lenses 4 arranged in a plurality of stages and the objective lens 6, and made to form an image on the sample 10 which is an observation target. The deflecting coil 5 causes the sample 10 to be scanned with the primary electron beam 3 at radiation positions over a desired observation range. As a result of the radiation with the primary electron beam 3, secondary electrons, reflected electrons 23 and characteristic X-rays are emitted from the sample 10.

The degree of vacuum inside the specimen chamber 9 is kept at a high level of vacuum by the vacuum pump 22 connected to the specimen chamber 9 via the vacuum pipe 21. Furthermore, by opening/closing a needle valve 24 or the like at an inlet for introducing the atmosphere into the specimen chamber 9, the interior of the specimen chamber 9 can be kept at a low degree of vacuum. Secondary electrons generated from the sample 10 are detected by the secondary electron detector 11. The secondary electron detector 11 is normally made up of a scintillator called "Everhart Thornley type detector" and a photomultiplier tube.

The X-ray detector 12 is normally provided with a semiconductor detector 27. This is a Si (Li$^+$) detector 27 in which Li$^+$ ions are diffused over p-type single crystal Si to neutralize acceptors and an intrinsic layer without charge is formed. The Si (Li$^+$) detector 27 and an amplifier 28 are thermally linked to a Dewar flask 30 via a cold finger 29 and are cooled with liquid nitrogen stored in the Dewar flask 30. When characteristic X-rays impinge on the intrinsic layer of the Si (Li$^+$) detector 27 through a collimator 25 and a window 26, electron/positive hole pairs are generated in proportion to the energy thereof and become a signal current. The signal current obtained is electrically amplified by the amplifier 28, inputted to a pulse height analyzer to become an X-ray spectrum and outputted. The X-ray detector 12 of the present embodiment has been described as the X-ray detector 12 provided with the Si (Li$^+$) detector 27, but it may also be the X-ray detector 12 provided with a silicon drift detector.

The reflected electrons 23 are detected by the top-BSE detector 16 and the Coax-BSE detector 15. Semiconductor detectors are normally used for these back scattered electron detectors. In the present embodiment, the element provided for the top-BSE detector 16 is radially divided into four portions, and the respective elements detect reflected electrons generated from the sample 10, add up or subtract from one another, and can thereby obtain information on projections and depressions having directivity.

Next, the Coax-BSE detector 15 will be described with reference to FIG. 2 and FIG. 3. The Coax-BSE detector 15 is provided with a fixing member 151, a support member 152 and a BSE element (reflected electron detection element) 153.

The support member 152 is a member that supports the BSE element 153. The support member 152 includes a support plate 152a and a support beam 152b. The BSE element 153 is fixed to the support plate 152a. Holes for allowing X-rays to pass therethrough are provided in the vicinity of the center of the support plate 152a and the BSE element 153 as a hole 152aa and a hole 153a respectively. Such a configuration provides a structure preventing a space between the collimator 25 disposed at a distal end of the X-ray detector 12 and the analysis position on the sample 10 from being blocked. When viewed as a whole, the Coax-BSE detector 15 is disposed coaxially with the X-ray detection plane of the X-ray detector 12. The characteristic X-rays from the sample 10 pass through the hole 153a and the hole 152aa in the center of the Coax-BSE detector 15, impinge from the collimator 25 of the X-ray detector 12, thus allowing an X-ray element analysis to be performed without causing the Coax-BSE detector 15 to retract.

The support beam 152b is intended to hold the support plate 152a by a predetermined distance ahead of the collimator 25. The support plate 152a is attached to one end of the support beam 152b and the fixing member 151 is attached on the other end side of the support beam 152b.

The fixing member 151 clamps the side of the distal end which is the X-ray receiving side of the housing 121 that covers the X-ray detector 12 and thereby fixes the support member 152 to the X-ray detector. The fixing member 151 is formed by bending a sheet member and the distal end side of the housing 121 is clamped and fixed by clamping both ends of the fixing member 151 with screws 154. The fixing member 151 and the support beam 152b are fixed using screws 156, and the support beam 152b and the support plate 152a are fixed using a screw 155. Therefore, when the screws 154, 155 and 156 are removed, the Coax-BSE detector 15 can be broken down into the support plate 152a, the support beam 152b and the fixing member 151.

Next, FIG. 4 illustrates a positional relationship between the top-BSE detector 16 and the Coax-BSE detector 15 and an example of back scattered electron images obtained. As shown in FIG. 4A, since the Coax-BSE detector 15 is disposed at a certain angle with respect to the surface of the sample 10, the Coax-BSE image obtained is a back scattered electron image having contrast different from that of the top-BSE image.

FIG. 4B illustrates an example of images obtained from the respective detectors. When there is a convex part on the sample 10, the top-BSE image is observed as an image of the surface structure of the periphery of the convex part viewed from above. On the other hand, since reflected electrons have high energy and a high rectilinear propagation property, with a Coax-BSE image, the reflected electrons 23 coming from the opposite side of the convex part viewed from the Coax-BSE detector 15 are blocked by the convex part and it is thereby not possible to obtain peripheral information thereof.

Similarly, since X-rays also have high energy and a high rectilinear propagation property, as in the case of the reflected electrons 23, it is not possible to obtain information of X-rays from a place hidden from the X-ray detector 12, and the collimator 25 at the distal end in particular. Such a phenomenon also occurs on the slope of the concave part on the Coax-BSE detector 15 side, causing a large effect on analysis data just as in the case of the convex part. Taking advantage of this, a Coax-BSE image is acquired in a preliminary stage of X-ray analysis and displayed on the image display terminal 19 together with the secondary electronic image or top-BSE image. From the image, the analyzer regards a place where contrast is high, that is, a place where X-rays generated from the sample 10 is obtained appropriately as an analysis position. On the contrary, by knowing that a place with low brightness is not suitable for an X-ray analysis in the preliminary stage of the analysis, the analyzer can perform an analysis with reliability secured without rework and in a short time.

By disposing the X-ray detector 12 coaxially with the Coax-BSE detector 15, it is possible to detect characteristic X-rays and reflected electrons generated from the same location. Thus, since a location from which a concavo-convex surface can be recognized from the Coax-BSE image coincides with a location from which an X-ray element analysis can be performed, it is possible to accurately determine a position on the sample suitable for an X-ray analysis from the Coax-BSE image. Moreover, using the Coax-BSE image acquired by the Coax-BSE detector 15 disposed coaxially with the X-ray detector 12, it is also possible to improve the accuracy of automatic determination of the analysis location.

Furthermore, the present embodiment also improves the conductor that extends from the Coax-BSE detector 15. As shown in FIG. 5, the conductor 31 is a wire that connects the Coax-BSE detector 15 and a feedthrough 32 and transmits a detection signal of the BSE element 153 to the image formation control section 17. The conductor 31 is a coil, one end of which is connected to the BSE element 153 which is the reflected electron detection element and the other end of which is connected to the feedthrough 32 of the scanning electron microscope 1 which is the charged particle beam apparatus so as to extend from the BSE element 153 which is the reflected electron detection element toward the rear end side which is the collimator 25 side which is the X-ray detection element of the housing 121.

As shown in FIG. 5A, when the X-ray detector 12 retracts into a position where it does not perform any X-ray element analysis, the conductor 31, which is a coil, shrinks and connects the Coax-BSE detector 15 and the feedthrough 32 without drooping. As shown in FIG. 5B, when the X-ray detector 12 moves forward up to a position where it performs an X-ray element analysis, the conductor 31, which is a coil, stretches and connects the Coax-BSE detector 15 and the feedthrough 32. Note that the conductor 31 is preferably made of a high polymer material that exhibits durability in vacuum and coated with a metal wire.

The Coax-BSE detector 15 of the present embodiment is applicable not only to a scanning electron microscope provided with the energy dispersive X-ray detector 12 but also to a scanning electron microscope provided with a wavelength dispersive X-ray analysis apparatus or a similar apparatus.

When an X-ray analysis was performed on a sample surface with projections and depressions using the scanning electron microscope according to the present embodiment, a good analysis result with high reproducibility was obtained.

As described so far, according to the present embodiment, it is possible to provide a charged particle beam apparatus that can evaluate/determine positions on a sample suitable for an X-ray analysis even in a preliminary stage of an X-ray element analysis, allowing the analyzer to perform an analysis with high reliability secured, without rework and in a short time.

Figure 6:
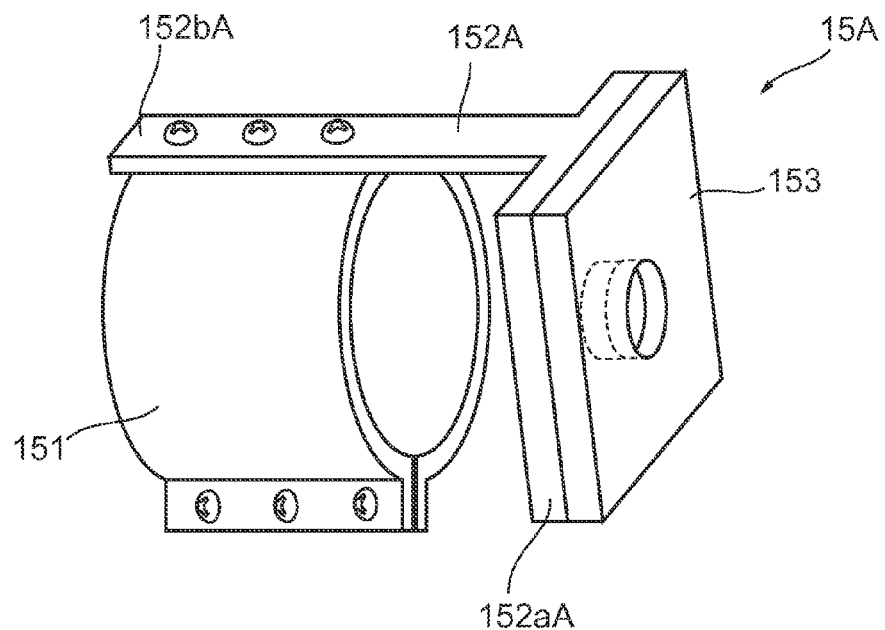
FIG. 6 is a schematic perspective view illustrating a first modification of the Coax-BSE detector shown in FIG. 2.

Next, a first modification of the Coax-BSE detector will be described with reference to FIG. 6. FIG. 6 is a schematic perspective view illustrating a Coax-BSE detector 15A which is a first modification of the Coax-BSE detector 15 shown in FIG. 2. In the Coax-BSE detector 15A, a support beam 152bA and a support plate 152aA are integrated into one body and configured as a support member 152A. Configuring the support member 152A as one body can improve the layout accuracy of the BSE element 153.

Figure 7:
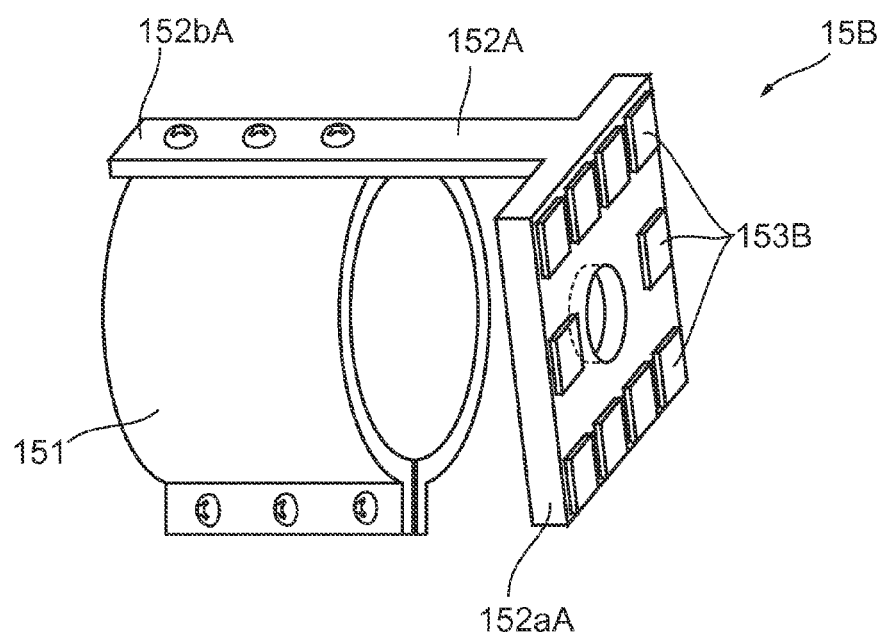
FIG. 7 is a schematic perspective view illustrating a second modification of the Coax-BSE detector shown in FIG. 2.

Next, a second modification of the Coax-BSE detector will be described with reference to FIG. 7. FIG. 7 is a schematic perspective view illustrating a Coax-BSE detector 15B which is a second modification of the Coax-BSE detector 15 shown in FIG. 2. As shown in FIG. 7, in the Coax-BSE detector 15B, the support beam 152bA and a support plate 152aA are integrated into one body and configured as a support member 152A. Configuring the support member 152A as one body can improve the layout accuracy of the BSE element 153. Moreover, the size of the BSE element 153B in the Coax-BSE detector 15B is smaller than the size of the BSE element 153 and eight BSE elements 153B are provided for the support plate 152aA. Providing the plurality of BSE elements 153B in this way makes it possible to combine output signals from the respective elements and improve measurement sensitivity.

Figure 8:
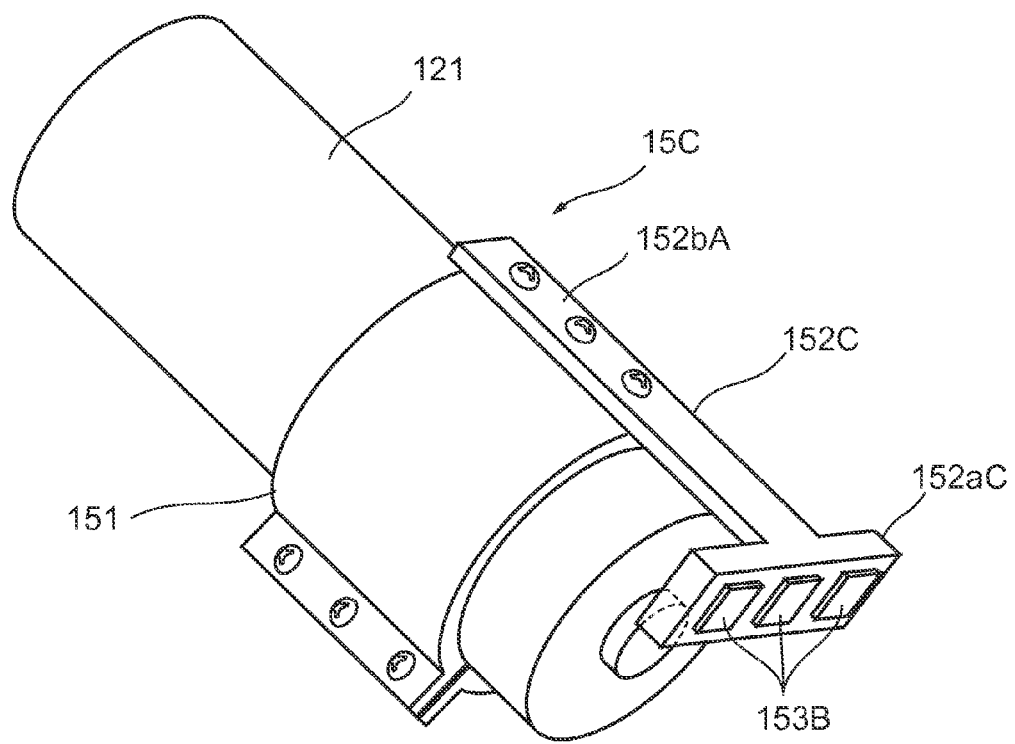
FIG. 8 is a schematic perspective view illustrating a third modification of the Coax-BSE detector shown in FIG. 2.

Next, a third modification of the Coax-BSE detector will be described with reference to FIG. 8. FIG. 8 is a schematic perspective view illustrating a Coax-BSE detector 15C which is a third modification of the Coax-BSE detector 15 shown in FIG. 2. As shown in FIG. 8, in the Coax-BSE detector 15C, the support beam 152bA and a support plate 152aC are integrated into one body and configured as a support member 152C. Configuring the support member 152C as one body can improve the layout accuracy of the BSE elements 153B. The support plate 152aC is provided so as to be positioned only above the path of X-rays so as not to block X-rays incident on the X-ray detector 12. Therefore, the support plate 152aC need not be provided with any hole for X-rays to pass therethrough. Moreover, using the fixing member 151 conforming to the diameter of the housing 121 allows the fixing member 151 to be attached to a variety of X-ray detectors.

Figure 9:
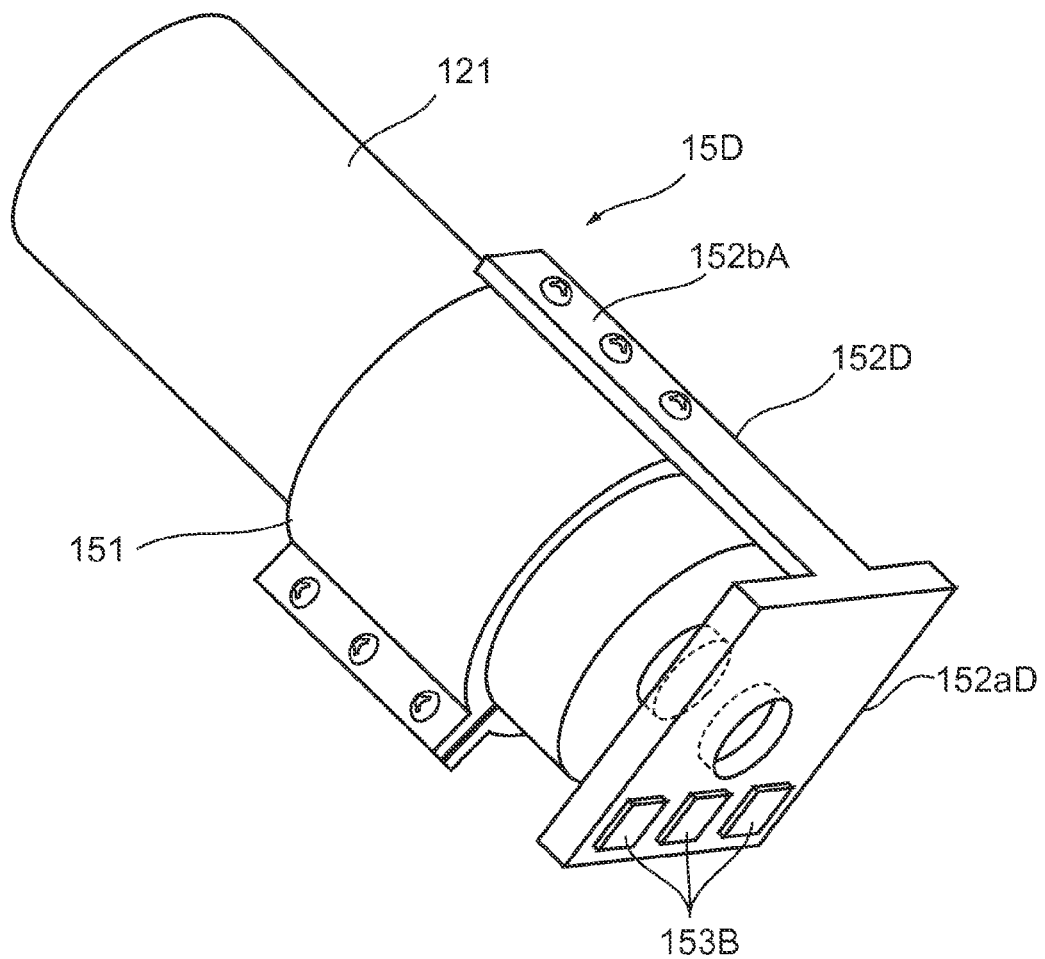
FIG. 9 is a schematic perspective view illustrating a fourth modification of the Coax-BSE detector shown in FIG. 2.

Next, a fourth modification of the Coax-BSE detector will be described with reference to FIG. 9. FIG. 9 is a schematic perspective view illustrating a Coax-BSE detector 15D which is a fourth modification of the Coax-BSE detector 15 shown in FIG. 2. As shown in FIG. 9, in the Coax-BSE detector 15D, the support beam 152bA and a support plate 152aD are integrated into one body and configured as a support member 152D. The support plate 152aD is provided with a hole so as not to block X-rays incident on the X-ray detector 12 and provided with BSE elements 153B so as to be positioned only below the path of X-rays. Such an arrangement of the BSE elements 153B allows an arrangement such that the angle of elevation of the optical axis of reflected electrons is smaller than that of the optical axis of X-rays, making it possible to determine the appropriateness of X-ray element analysis more strictly.

Figure 10:
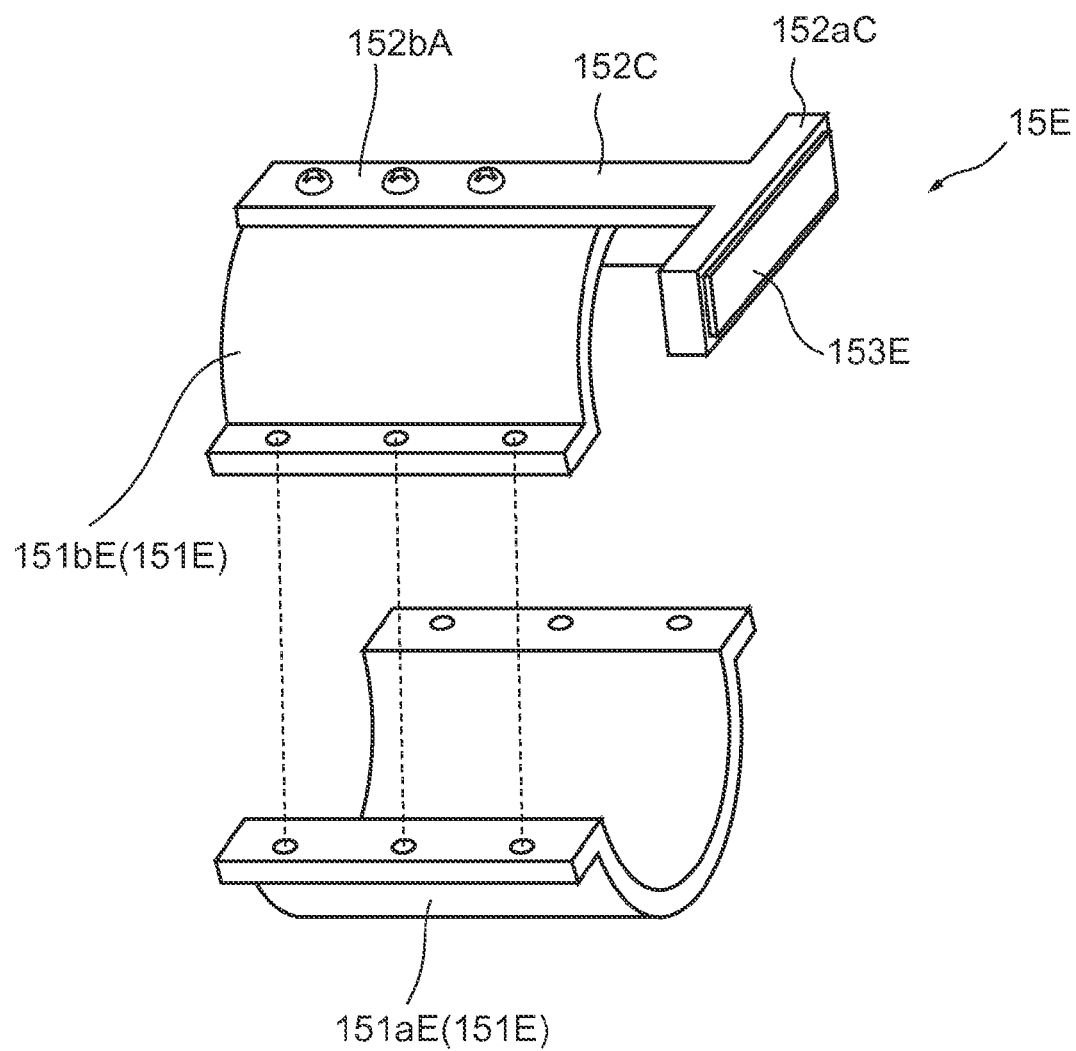
FIG. 10 is a schematic perspective view illustrating a fifth modification of the Coax-BSE detector shown in FIG. 2.

Next, a fifth modification of the Coax-BSE detector will be described with reference to FIG. 10. FIG. 10 is a schematic perspective view illustrating a Coax-BSE detector 15E which is a fifth modification of the Coax-BSE detector 15 shown in FIG. 2. As shown in FIG. 10, in the Coax-BSE detector 15E, the support beam 152bA and the support plate 152aC are integrated into one body and configured as a support member 152C. Configuring the support member 152C as one body can improve the layout accuracy of a BSE element 153E. The support plate 152aC is provided so as to be positioned only above the path of X-rays so as not to block X-rays incident on the X-ray detector 12. Therefore, the support plate 152aC need not be provided with any hole for X-rays to pass therethrough. Moreover, the fixing member 151E is shaped like a cylinder divided into two portions along the axial direction, and configured of a first portion 151aE and a second portion 151bE. Since the first portion 151aE and the second portion 151bE can be attached to the housing 121 so as to sandwich the housing 121, the material thereof is not limited to an elastic material and can be formed of substantially inelastic cast or through metal cutting.

Figure 11:
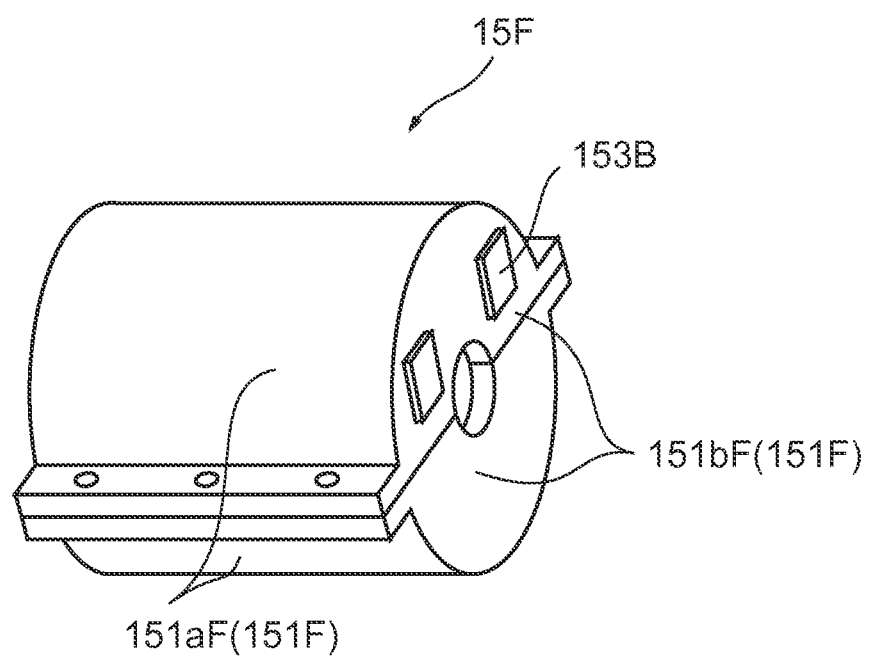
FIG. 11 is a schematic perspective view illustrating a sixth modification of the Coax-BSE detector shown in FIG. 2.

Next, a sixth modification of the Coax-BSE detector will be described with reference to FIG. 11. FIG. 11 is a schematic perspective view illustrating a Coax-BSE detector 15F which is a sixth modification of the Coax-BSE detector 15 shown in FIG. 2. As shown in FIG. 11, the Coax-BSE detector 15F uses a pair of bottomed semi-cylindrical members 151F. The bottomed semi-cylindrical member 151F includes a fixing section 151aF corresponding to the fixing member 151 and a base section 151bF corresponding to the support member 152. Such a configuration allows BSE elements 153B to be disposed on the base section 151bF and allows the fixing sections 151aF to sandwich the housing 121, making it possible to arrange the BSE elements 153B at appropriate positions. Since the pair of fixing sections 151aF can be attached to the housing 121 so as to sandwich the housing 121, the material thereof is not limited to an elastic material but can be formed of substantially inelastic cast or through metal cutting.

Figure 12:
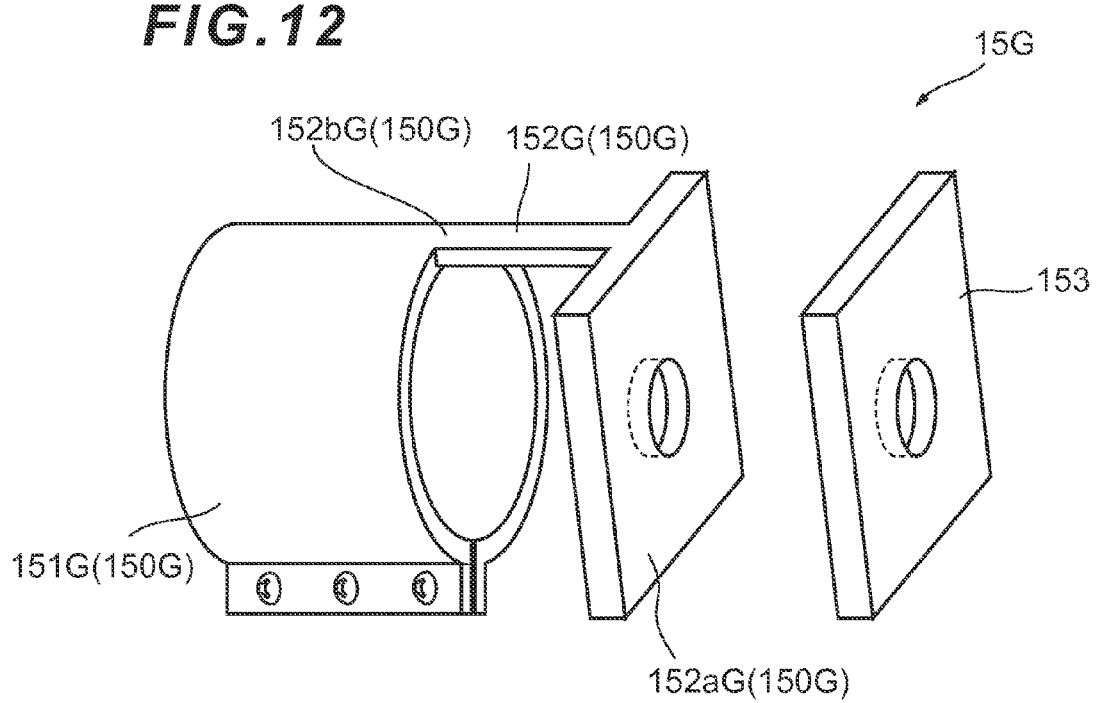
FIG. 12 is a schematic perspective view illustrating a seventh modification of the Coax-BSE detector shown in FIG. 2.
Figure 13:
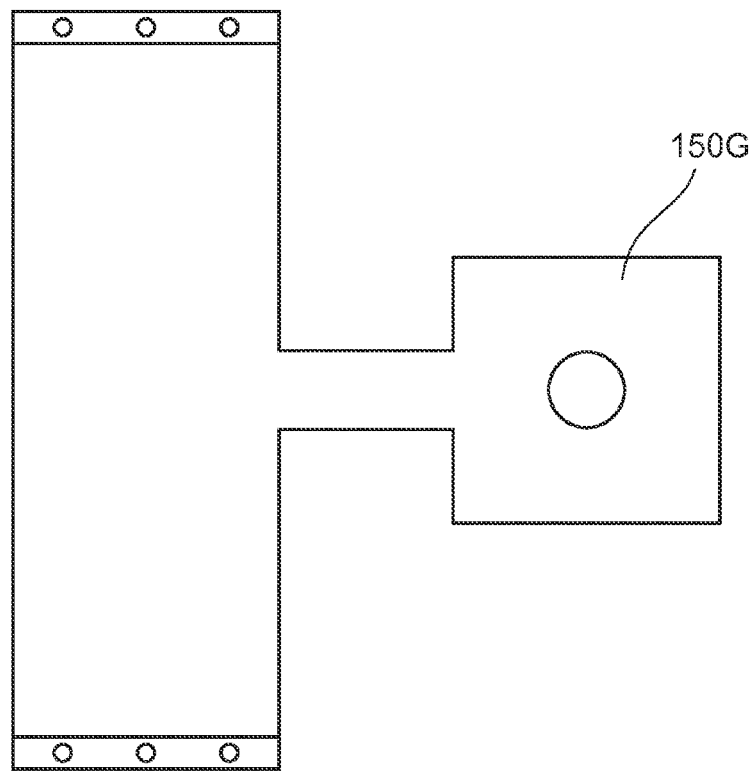
FIG. 13 is a plan view illustrating a sheet member making up the support member and the fixing member of the Coax-BSE detector shown in FIG. 12.

Next, a seventh modification of the Coax-BSE detector will be described with reference to FIG. 12. FIG. 12 is a schematic perspective view illustrating a Coax-BSE detector 15G which is a seventh modification of the Coax-BSE detector 15 shown in FIG. 2. As shown in FIG. 12, in the Coax-BSE detector 15G, a support beam 152bG and a support plate 152aG are integrated into one body and configured as a support member 152G, and the fixing member 151G is also integrated as one body and configured as a holder 150G. As shown in FIG. 13, the holder 150G is formed by cutting one sheet into shapes corresponding to the respective sections and folding the sheet. By integrally configuring the fixing member 151G and the support member 152G as the holder 150G, it is possible to improve the layout accuracy of the BSE element 153.

Figure 14:
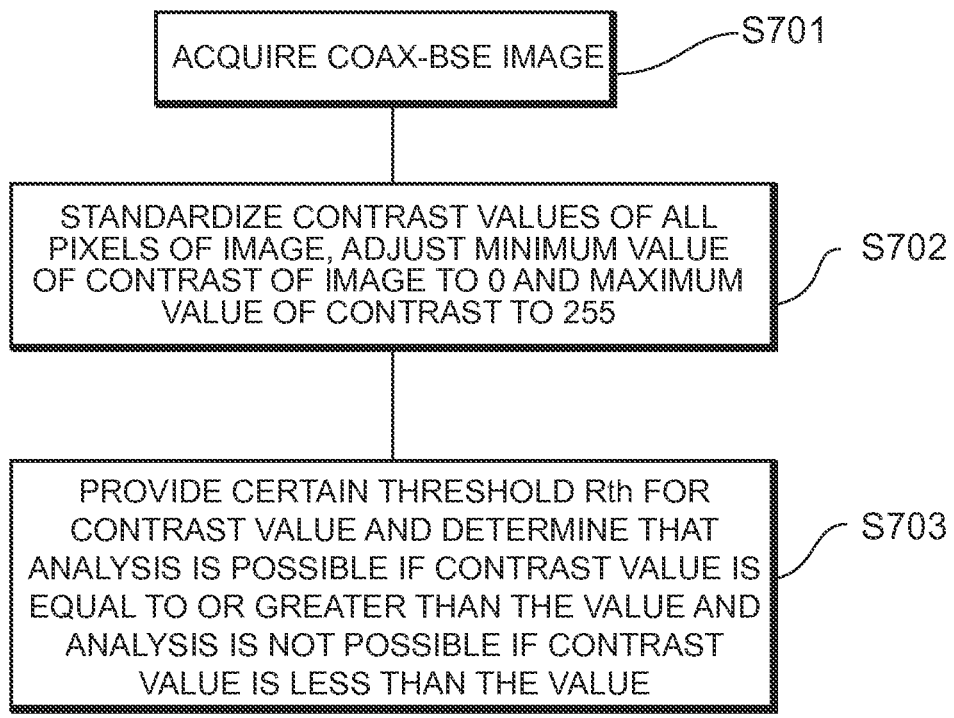
FIG. 14 is a processing flow for determining whether an observation position is analyzable or not.

A measuring method using the scanning electron microscope 1 according to the present embodiment will be described using FIG. 14 to FIG. 16. Note that operation of the scanning electron microscope 1 is controlled by a control section such as the SEM overall control section 18. In this description, positions where an X-ray element analysis is possible will be determined using not the top-BSE detector 16 but only the Coax-BSE detector 15. FIG. 14 illustrates a processing flow for obtaining an optimum X-ray analysis position in the present embodiment. FIG. 15 describes the processing flow in FIG. 14 using a Coax-BSE image actually acquired using the Coax-BSE detector 15. FIG. 16 shows windows displayed at the time of determination of an analysis position.

Figures 15A, 15B:
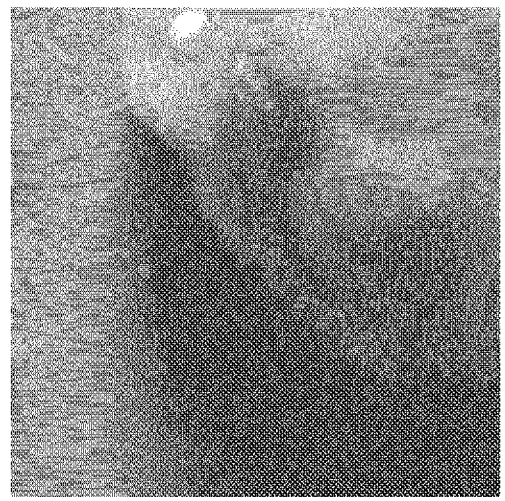
FIG. 15A and FIG. 15B are views illustrating the processing flow in FIG. 14.

STEP1 (S701 in FIG. 14):

A Coax-BSE image is acquired using the Coax-BSE detector 15 (FIG. 15A). Suppose the number of pixels of the image obtained then is m in the horizontal direction and n in the vertical direction and the image is shown in FIG. 15B.

STEP2 (S702):

The Coax-BSE image acquired in STEP1 is quantized, for example, in 8 bits and when the image is expressed in a gray scale image of 256-step gradation, contrast values of all pixels are standardized, a minimum value of contrast of the image is adjusted to 0 and a maximum value of contrast is adjusted to 255.

STEP3 (S703):

A threshold Rth is provided for the contrast value, the contrast value standardized in STEP2 is compared with Rth, and a place is determined to be a place suitable for an analysis when the standardized contrast value is equal to or above Rth and determined to be a place not suitable for analysis when the standardized contrast value is less than Rth. Since the contrast value is standardized, a default value of Rth can be provided, but the analyzer may also optionally set the contrast value from the window in FIG. 16A.

This is the description of the processing flow in FIG. 14. A place where the contrast value obtained in STEP2 (S702) is larger can be said to include fewer obstacles between the Coax-BSE detector 15 and the radiation location of the electron beam 3, with the radiation location being oriented toward the Coax-BSE detector 15. The same applies to X-rays coming out from the radiation location of electron beam 3. In a place where the contrast value is larger, the amount of X-rays incident on the Si (Li$^+$) detector 27 from the collimator 25 of the X-ray detector 12 increases. That is, if a place where the contrast value of the Coax-BSE image is large is assumed to be an X-ray analysis position, it is possible to perform an analysis with high reliability secured without rework and in a short time. In the processing flow in FIG. 14, the contrast value is evaluated in pixel units, however, for example, an image may be divided into x by y portions, contrast values in the divided unit region may be averaged and the average value may be compared with the threshold Rth. It is thereby possible to avoid influences of fluctuation of the electron source 2, electrical noise, pixel level noise caused by local charge of the sample 10 or the like. The processing flow in this case is as follows.

STEP1A:

A Coax-BSE image is acquired by the Coax-BSE detector 15. Suppose the number of pixels of the image obtained in this case is m in the horizontal direction and n in the vertical direction.

STEP2A:

When the Coax-BSE image obtained in STEP1A is quantized, for example, in 8 bits and expressed by a 256-step gradation gray scale image, contrast values of all pixels are standardized and a minimum value of contrast of the image is adjusted to 0 and a maximum value of contrast is adjusted to 255.

STEP3A:

For example, an image is divided into x by y portions and a minimum region of determination is defined. Suppose the analyzer can optionally set x and y from the window in FIG. 16B.

STEP4A:

Contrast values are averaged in the region units defined in STEP3A, the place is determined to be suitable for the analysis when the average value is Rth or above and determined to be not suitable for the analysis when the average value is less than Rth. Since the contrast values are standardized, a default value of Rth can be provided, but the analyzer may also optionally set Rth from the window in FIG. 16B.

Figure 16A:
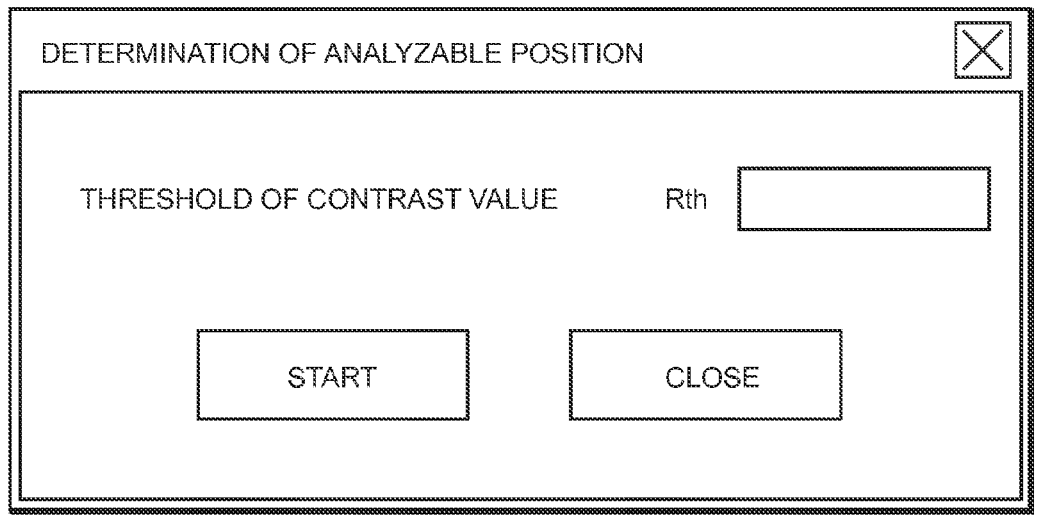
FIG. 16A and FIG. 16B illustrate dialog boxes displayed when determining an analyzable position and an unanalyzable position.
Figure 16B:
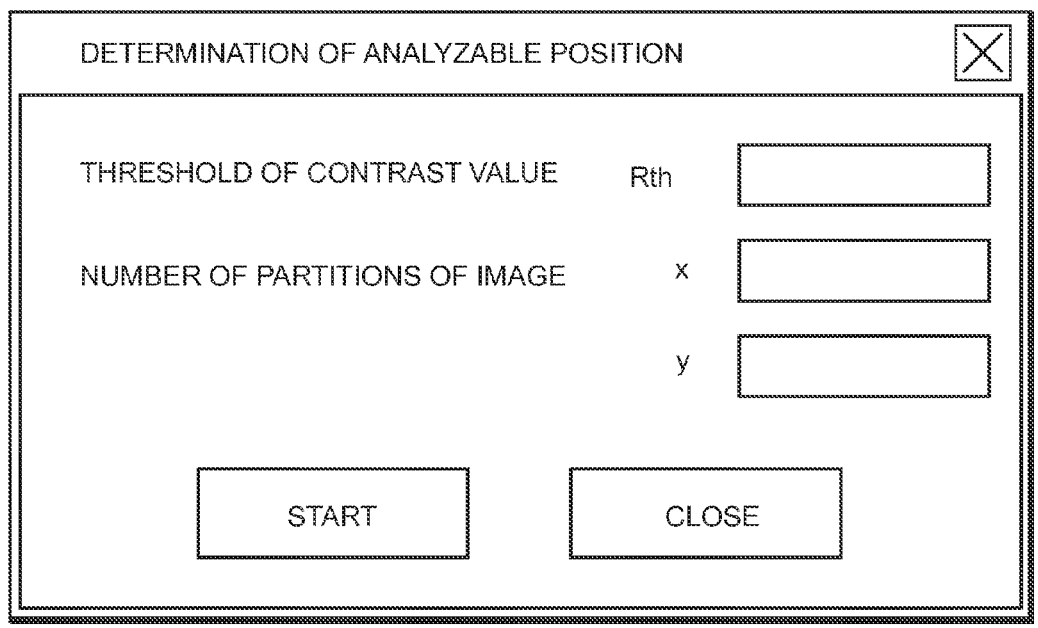

Next, the threshold Rth of the contrast value described in the processing flow in FIG. 14 is defined using FIG. 16, and a window will be described which is displayed on the image display terminal 19 when starting and ending a determination of the analysis position. When determining a position at which an analysis is possible, the analyzer first causes the window in FIG. 16A to be displayed on the image display terminal 19. Next, the analyzer inputs a "threshold of contrast value" Rth to a box to determine an analyzable position. For example, "90" is inputted to the box as a default value, and this value is normally used, but the analyzer can optionally input an integer of 0 to 255. An error message will be displayed when other values are inputted. Then, the analyzer presses a "start" button in FIG. 16A. The processing flow in FIG. 14 is thereby performed. When ending the determination of the analysis position and moving to a normal observation, the analyzer presses a "close" button in FIG. 16.

The following procedure is used to determine the analyzable position using the processing flows in STEP1A to STEP4A. The analyzer first causes the window in FIG. 16B to be displayed on the image display terminal 19. Next, the analyzer inputs the "threshold of contrast value" Rth, the "number of partitions of image" x and y to their respective boxes to determine the analyzable position. For example, "90" is inputted to the box of Rth as the default value, and this value is normally used, but the analyzer can optionally input an integer of 0 to 255. The values x and y are each an integer by which the number of pixels of the image (m, n) is divisible and assumed to be values equal to or less than the number of pixels of the image (m, n) and equal to or greater than 1. If values other than the values that can be inputted are inputted to the respective boxes, an error message is displayed. Then, the analyzer presses the "start" button in FIG. 16B. In this way, the processing flows in STEP1A to STEP4A are performed. When ending the determination of the analysis position and moving to a normal observation, the analyzer presses the "close" button in FIG. 16B.

Through the above-described processing flows, it is possible to present the reliability of the analysis result to the analyzer in a preliminary stage of the X-ray element analysis. As a result, the analyzer can perform an analysis with high reliability secured without rework and in a short time.

When an X-ray analysis was performed on a sample surface with projections and depressions using the scanning electron microscope according to the embodiment, an analysis result with excellent reproducibility was obtained.

As described so far, according to the present embodiment, it is possible to provide a charged particle beam apparatus that can automatically evaluate/determine positions on a sample suitable for an X-ray analysis in a preliminary stage of an X-ray element analysis, and allows the analyzer to perform an analysis with high reliability secured without rework and in a short time.

What is claimed is:

1. A back scattered electron detector used together with an X-ray detector included in a charged particle beam apparatus, the charged particle beam apparatus including an another back scattered electron detector arranged between an electron source and a sample and, as seen from the sample, the another back scattered electron detector being arranged on same side as the X-ray detector at a different angle than the X-ray detector, comprising:

a reflected electron detection element;
   a support member that supports the reflected electron detection element; and
   a fixing member for fixing the support member to the X-ray detector, wherein the fixing member fixes the support member by clamping a side portion on a distal end side, which is an X-ray receiving side, of a housing that covers the X-ray detector.

2. The back scattered electron detector according to claim 1, wherein the support member is configured so as to be detachably attached to the fixing member.

3. The back scattered electron detector according to claim 1, further comprising a conductor for transmitting a reflected electron signal outputted from the reflected electron detection element,
    wherein one end of the conductor is connected to the reflected electron detection element so that the conductor extends toward a rear end side which is the X-ray detection element side of the housing, and the other end side is connectable to a feedthrough of the charged particle beam apparatus.

4. The back scattered electron detector according to claim 3, wherein the conductor is a coil.

5. A charged particle beam apparatus comprising:
    an X-ray detector;
    a first back scattered electron detector arranged between an electron source and a sample and, as seen from the sample, the first back scattered electron detector being arranged on same side as the X-ray detector at a different angle than the X-ray detector;
    a second back scattered electron detector used together with the X-ray detector, the second back scattered electron detector being mounted on a distal end, which is an X-ray receiving side, of a housing that covers the X-ray detector, and includes:
        a reflected electron detection element;
        a support member that supports the reflected electron detection element; and
        a fixing member for fixing the support member to the X-ray detector, wherein the fixing member fixes the support member by clamping a side portion on the distal end side, of the housing,
    wherein the X-ray detector detects an X-ray signal and the second back scattered electron detector detects a reflected electron signal.

6. The charged particle beam apparatus according to claim 5, wherein an amount of reflected electron signal per pixel in a back scattered electron image is analyzed using a back scattered electron image obtained based on the reflected electron signal to determine detection efficiency of the X-ray signal.

7. The charged particle beam apparatus according to claim 5, wherein the support member is configured so as to be detachably attached to the fixing member.

8. The charged particle beam apparatus according to claim 5, further including a conductor for transmitting a reflected electron signal outputted from the reflected electron detection element,
    wherein one end of the conductor is connected to the reflected electron detection element so that the conductor extends toward a rear end side which is the X-ray detection element side of the housing, and the other end side is connectable to a feedthrough of the charged particle beam apparatus.

9. The charged particle beam apparatus according to claim 8, wherein the conductor is a coil.

* * * * *